United States Patent
Wang

(10) Patent No.: US 7,461,310 B2
(45) Date of Patent: Dec. 2, 2008

(54) IC FUNCTIONAL AND DELAY FAULT TESTING

(75) Inventor: Hsin-Po Wang, Hsin-Chu (TW)

(73) Assignee: Springsoft, Inc., Hsinchu (TW)

( * ) Notice: Subject to any disclaimer, the term of this patent is extended or adjusted under 35 U.S.C. 154(b) by 383 days.

(21) Appl. No.: 11/450,941

(22) Filed: Jun. 8, 2006

(65) Prior Publication Data

US 2007/0288818 A1    Dec. 13, 2007

(51) Int. Cl.
 *G01R 31/28* (2006.01)
(52) U.S. Cl. .................. 714/729; 714/727; 714/731
(58) Field of Classification Search .............. 714/700, 714/726, 742, 738, 729, 727, 731
 See application file for complete search history.

(56) References Cited

U.S. PATENT DOCUMENTS

| | | | |
|---|---|---|---|
| 6,954,887 B2 * | 10/2005 | Wang et al. | 714/729 |
| 7,216,280 B2 * | 5/2007 | Benware | 714/738 |
| 2002/0112208 A1 | 8/2002 | Kakizawa et al. | |
| 2006/0242474 A1 * | 10/2006 | Jun et al. | 714/700 |
| 2006/0253753 A1 * | 11/2006 | Gunda et al. | 714/726 |
| 2007/0061657 A1 * | 3/2007 | Chang et al. | 714/742 |

* cited by examiner

*Primary Examiner*—David Ton
(74) *Attorney, Agent, or Firm*—Daniel J. Bedell; Smith-Hill and Bedell

(57) ABSTRACT

An integrated circuit (IC) tester tests an IC having logic blocks that communicate through clocked devices arranged into scan chains. The tester organizes a low-speed IC functional test into a succession of test cycles, each of a uniform test cycle period, and can clock each clocked device up to once per test cycle with adjustable clock signal edge timing. At selected times during the functional test, the tester executes a capture procedure wherein it adjusts clock signal edge timing so that a delay between clocking of the input and output signals of selected logic blocks is less than the test cycle period to determine whether those logic blocks can operate at high frequency without delay faults. The tester executes a scan procedure immediately following each capture procedure to acquire data representing states of logic block output signals to enable the tester to determine whether one or more selected logic blocks experienced delay faults during the capture procedure.

23 Claims, 7 Drawing Sheets

IC FUNCTIONAL AND DELAY FAULT TESTING

BACKGROUND OF THE INVENTION

1. Field of the Invention

The invention relates in general to integrated circuit testing and in particular to a method for performing both functional and delay fault testing on an integrated circuit.

2. Description of Related Art

A digital integrated circuit (IC) typically includes a large number of logic blocks communicating with one another through clocked devices such as registers and flip-flops. For example FIG. 1 illustrates a simple integrated circuit 10 including a set of six primary inputs PI1-PI6 for receiving input signals, a set of logic blocks L1-L6 for performing logic operations on the input signals to produce a single primary output signal P0. A set of clocked devices, in this example flip-flops F1-F5, are included in signal paths between logic blocks L1-L6 to synchronize state changes in signals passing between the logic blocks to edges of a clock signal CLK that clocks all flip-flops. Although for simplicity IC 10 is illustrated as including only a few input, output and clock signals, logic blocks and clocked devices, a typical IC will have many more primary inputs and outputs, logic blocks and clocked devices. Also, though in this simple example, all clocked devices F1-F5 are clocked by the same clock signal CLK, many ICs employ two or more clock signals of varying phases to clock clocked devices.

Functional Testing

As illustrated in FIG. 2, an IC tester 12 performs a functional test on IC 10 by applying signal patterns to the IC's primary inputs PI1-PI6 and clock input CLK and by monitoring the IC's primary output signal PO to determine whether it behaves as expected. When IC 10 is unpackaged, tester 12 can employ probes to also access and monitor some of the IC's internal signals, such as signals S1-S5. IC testers are typically "cycle based" in that they organize a test into a succession of test cycles of uniform length, and carry out test activities during each test cycle. During each test cycle, tester 12 may change the state of test signals supplied to IC 10 input terminals or sample IC output signals to determine whether they are of expected states. A typical tester 12 is programmed to generate a separate test vector (variously called a functional, operation or behavioral vector) for each IC input/output (IO) terminal prior to the start of each test cycle indicating the test activity to be carried out at the IC IO terminal. The vectors are typically derived from data produced by a circuit simulator indicating the expected response of IC's internal and output signals to a particular input signal pattern.

The maximum frequency at which tester 12 can test IC 10 depends in part on the period of the test cycle. A shorter test cycle period permits a higher test cycle frequency. Since a tester must supply and process a set of vectors at the start of each test, the maximum frequency at which it can test an IC is often limited by the maximum rate at which it can generate and process test vectors. The test frequency also depends on the number of test activities per cycle each vector can define. The frequency at which tester 12 can test IC 10 of FIG. 1 is limited by the frequency at which it can generate the CLK signal. If a vector can define only a single test signal state change per test cycle, then a full clock signal cycle, including both a rising and falling pulse edges, will require two test cycles. In such case the maximum test cycle frequency will be 1/2P, where P is the tester's minimum possible test cycle period in nanoseconds. Tester 12 can test IC 10 at a higher test frequency when a vector can define more than one activity per test cycle at any given IC IO terminal. For example, when a vector can define up to two activities per test cycle, it can tell tester 12 to drive the CLK signal high at one point during a test cycle and to drive it low at another point during a test cycle. Since such a tester 12 would need only one test cycle period to produce a complete CLK signal cycle, tester 12 will be able to test IC 12 at a maximum test frequency of 1/P. When a vector can define up to four activities per IC IO terminal per test cycle, tester 12 could test IC 10 at a maximum test frequency of 2/P.

The cost of an IC tester is an increasing function of its maximum test frequency. When a fast, but relatively expensive, tester 10 performs an "at-speed" functional test by clocking IC 10 at its intended operating frequency, timing-related defects in the IC can cause detectable errors in the monitored IC signals. Thus an at-speed test can test both the logic and the timing of an IC. A relatively inexpensive, but slow, tester 12 can perform a low-speed functional test by clocking IC 10 at a lower frequency than its intended operating frequency. However although a low-speed functional tester 12 can verify the logic of logic blocks L1-L6, it cannot determine whether the logic blocks and their interconnecting paths have sufficiently low path delays to enable them to operate when the IC is clocked at its intended operating frequency. The need for high-speed testing has grown as the operating frequencies of IC continue to increase, but it has become increasingly more difficult to design testers capable of performing at-speed functional tests.

Scan Chains

An IC's clocked devices (registers, flip-flops, etc) can be organized into one or more scan chains that enable an IC tester to directly read and set the states of the output signals of those devices even when it does not have direct access to those signal. FIG. 3 illustrates a simplified IC 14 similar to IC 10 of FIG. 1 except that its flip-flops F1-F5 are interconnected through a set of multiplexers M1-M5 to form a scan chain. During normal IC operation, the scan enable signal SE control input to multiplexers M1-M5 are de-asserted (set to a logical 0) so that multiplexers M1-M5 connect the outputs of logic blocks L1-L5 to the inputs of flip-flops F1-F5, respectively. During a scan mode of operation, an IC tester can assert (set to a logical 1) the SE control signal so that multiplexers M1-M5 connect the inputs and outputs of flip-flops F1-F5 in series between a scan input terminal SI and a scan output terminal SO. In the scan mode, successive edges of the CLK signal shift serial data arrive from the IC tester on scan input terminal SI into flip-flips F1-F5 and shift data representing the output signals S1-S5 of flip-flops F1-F5 out of the IC via scan output terminal SO. Thus an IC tester can use the scan mode to set the S1-S5 signals to desired states and/or to read the states of the S1-S5 signals.

Scan Dump Testing

As shown in FIG. 4, an IC tester 16 accessing the logic 18 of IC 14 via its primary input, output and clock signals and accessing the IC's scan chain via its SE, SI and SO terminals can halt a functional test and carry out a "scan dump" using scan chain 20 to read the states of the output signals S1-S5 of flip-flops L1-L6 of FIG. 3.

FIG. 5 illustrates timing relationships between the clock signal CLK signal and the scan enable signal. During a functional test, when IC tester 16 is supplying a pattern of input signals PI1-PI6 to logic 18 and monitoring the primary output signal P0, the tester holds the scan enable signal low so that the combinatorial logic 18 operates in its normal mode. At time T1, tester 16 asserts scan enable signal SE to place IC 14 in its scan mode. Thereafter, successive edges of clock signal CLK serially shift out data representing states of flip-flop output signals S1-S5.

When tester 16 performs low-speed functional test, the tester can avoid having to restart the test from the beginning after performing a scan dump during any test cycle by reloading the dumped scan data back into the IC before starting the next test cycle. Scan dumps are not performed in in an at-speed test because shifting to scan mode disrupts circuit timing. However the low-speed function test may not detect any of the errors if they result from excessive propagation delays in the logic producing signal.

Error Diagnosis Using Scan Dump Testing

FIG. 6 illustrates various pass/fail states of signals of IC 14 as detected by tester 16 of FIG. 4 during several cycles of a test. Each small box represents a result of a comparison between a signal's actual state and its expected state during a clock cycle. An empty box indicates that the corresponding signal was of its expected state during the corresponding clock cycle. A solid black box indicates that the corresponding signal was of an unexpected state during the corresponding clock cycle and that the signal state error was a "initial error" in the sense that the error in the signal was caused by a defect in the logic block controlling the signal and not by an error in any input signal to that logic block. A box containing an X indicates that the corresponding signal was of an unexpected state during the corresponding clock cycle, and that the signal error propagated from an earlier error in another signal. A test engineer wants to know which signals may be of unexpected states during any given test cycle because that information can help the test engineer to determine which logic blocks may contain logic or path delay errors. However, the test engineer may not be able to deduce the cause of every signal error from the tester output data.

During an at-speed functional test in which tester 16 can observe only the IC's primary output signals P0, it will report an error in that signal at clock cycle 221. However it does not report the unobservable errors in signals S2, S3 and S5 at cycles 219 and 220. The test engineer might want to know whether the error in PO at cycle 221 was an original error occurring in logic block L6 during cycle 221 or a propagation error resulting from an error in some other logic block at an earlier test cycle. Suppose the test engineer reprogrammed the tester to repeat the test from the first clock cycle, performing a first scan dump at cycle 220. When the scan data indicates there are errors in signals S3 and S5 at cycle 220, the test engineer could reprogram the tester to repeat the test from the first clock cycle, performing a second scan dump at test cycle 219. Since the scan data indicates an error in signal S2, the test engineer might reprogram the tester to repeat the test from the first clock cycle, performing a third scan dump at test cycle 218. Since there are no errors at test cycle 218, the test engineer ceases the scan process.

At this point the tester output data will tell the test engineer that errors occurred in signal S2 at cycle 219, in signals S3 and S5 at cycle 220, and in signal P0 at cycle 221. The test engineer will be able to infer that the error in signal S2 at cycle 219 was an original error, but will not be able to determine from the test result data whether that error was due to a logic error in logic block L2 of FIG. 3 or was due to a path delay error in logic block L2. Also, the test engineer will not be able to directly determine from the test result data whether the errors in signals S3 and S5 at cycle 220 or in signal P0 at cycle 221 were propagation errors or whether they were original errors resulting from logic faults or path delay errors in the logic blocks that generate those signals.

U.S. Patent Publication 2002/0112208 A1, published Aug. 15, 2002 for an application filed Jan. 9, 2001 by Kakizawa et al describes a generally similar approach scan dump testing.

ATPG Scan Testing

Tester 16 of FIG. 4 can use the scan chain 20 to directly set the states of the IC's internal signals that are accessible to the scan chain. In automatic test pattern generation (ATPG) scan testing, as illustrated in the timing diagram of FIG. 7, tester 16 drives the shift enable signal high during a first "shift window" spanning several clock cycles between times T1 and T2 to enable scan chain 20 and then uses the scan chain to serially shift data into flip-flops F1-F5 (FIG. 3), thereby driving signals S1-S5 to a desired pattern of states. Tester 16 then drives the shift enable signal SE low between times T2 and T3 to disable scan chain 20 and (optionally) inhibits a next clock signal pulse to allow the effects of any state changes in signals S1-S5 to propagate through logic blocks L1-L5 of FIG. 3. An edge of a next CLK signal pulse at time clocks the outputs of logic blocks L1-L5 into flip-flops F1-F5 so that at time T3, the outputs of flip-flops F1-F5 reflect the response of logic blocks L1-L5 to the S1-S5 input signal pattern supplied during the first shift window. During a second shift widow between times T3 and T4, tester 16 drives the shift enable signal high to enable scan chain 20 and uses it to shift out data representing states of signals S1-S5. During the second shift window between times T3 and T4, tester 16 also shifts in new pattern data to set the S1-S5 signals to new states for a next capture procedure between times T4 and T5. The test vectors for programming a tester to carry out ATPG scan testing are typically produced by ATPG tools that analyze a circuit model to determine how to test each individual logic block to detect particular types of faults within that logic block.

For IC 14 of FIG. 3, ATPG scan testing can allow tester 16 to directly control the states of inputs S1, S2, S3 and S6 to logic blocks L3, L5 and L5 rather than indirectly controlling them by controlling only states of primary input signal PI1-PI6, thereby making it easier to test each block for its response to various input signal patterns. The tester can repeatedly alternate between scan and capture procedures to determine the response of each logic block to various patterns of input signals. One drawback to the type of ATPG scan testing illustrated in FIG. 7 is that while it allows a tester to detect "stuck-at" faults and other logic errors in an IC's logic blocks, it does not allow the tester to detect timing errors because the tester allows more time between times T2 and T3 and between times T4 and T5 for signals to propagate through the logic blocks than would be permitted when the IC is operating at its normal operating frequency, as for example, in an at-speed functional test.

Delay Fault ATPG Scan Testing

FIG. 8 illustrates timing relationships between the clock CLK and scan enable signals when tester 16 of FIG. 4 performs a modified form of ATPG scan testing that can detect delay faults. During a first scan procedure spanning times T1 through T2, tester 16 drives the shift enable signal high to enable scan chain 20 and uses it to serially shift data into flip-flops F1-F5 to drive signals S1-S5 of FIG. 3 to a desired pattern of states. Tester 16 then drives the shift enable signal SE low at time T2 to disable scan chain 20. During a first capture procedure spanning times T2-T5, tester 16 delays a next edge of clock signal CLK for a time following time T2 to allow the effects of any state changes in signals S1-S5 to propagate through logic blocks L1-L5 of FIG. 3. An edge of a next CLK signal pulse at time T3 clocks the outputs of logic blocks L1-L5 into flip-flops F1-F5 so that the outputs of flip-flops F1-F5 reflect the response of logic blocks L1-L5 to the S1-S5 input signal pattern supplied during the first scan procedure. A next clock signal edge at time T4 again clocks the outputs of logic blocks L1-L5 into flip-flops F1-F5 so that at time T5, the outputs of flip-flops F1-F5 reflect the response of logic blocks L1-L5 to the S1-S5 input signal pattern following the first capture procedure. During a second scan procedure starting at time T5, tester 16 drives the shift enable signal high to enable scan chain 20 and uses it to shift out data representing the second captured states of signals S1-S and to shift new data into flip-flops F1-F5 to drive signals S1-S5 of FIG. 3 to a next desired pattern of states. Tester 16 then drives the shift enable signal SE low at time T6 to disable scan chain 20. During a second capture procedure spanning times T6-T9, tester 16 produces a CLK signal edge at time T7 to clock the outputs of logic blocks L1-L5 into flip-flops F1-F5 so that the outputs of flip-flops F1-F5 reflect the response of logic blocks L1-L5 to the S1-S5 input signal pattern supplied during the second scan procedure. A clock signal edge at time T8 again clocks the outputs of logic blocks L1-L5 into flip-flops F1-F5 so that at time T9, the outputs of flip-flops F1-F5 reflect the response of logic blocks L1-L5 to the S1-S5 input signal pattern following the second capture procedure.

Tester 16 adjusts the delay between CLK signal edges occurring at times T3 and T4 and between CLK signal edges occurring at times T7 and T8 so that the logic blocks L1-L5 have a controlled amount of time to respond to changes in their input signal states between the two clock signal edges. An excessive path delay in any logic block L1-L5 can cause an error in the state of the output signal of that block reflected by the scan data captured during the second shift window.

A low speed tester that is not fast enough to perform an at-speed functional test can use this technique to perform delay testing even though the period between test cycles is longer than the period between times T3 and T4, provided that the tester can control the timing of CLK signal edges within each test cycle with high resolution. FIG. 8 shows how tester 16 can position each CLK signal pulse within a test cycle. When tester 16 produces the CLK signal pulse starting at time T3 near the end of test cycle 6 and produces the CLK signal pulse starting at time T4 near the beginning of a test cycle 7, the period T4-3 between clock signal edges is much smaller than the period of each test cycle. The "idle" test cycles 5 and 12 in which no CLK signal pulses occur are provided to ensure the IC logic settles to steady state before the delay default test begins at times T3 and T7. In some cases the idle cycles can be omitted.

At-speed functional testing is advantageous because it directly verifies that an IC behaves in the manner predicted by a circuit simulator and can detect timing errors. However when at-speed functional testing is not practical, test engineers can employ low-speed functional testing to verify that the IC logically behaves in the predicted manner and can employ delay fault ATPG scan testing to determine whether path delays within the IC's logic blocks are within acceptable limits. The drawback to this approach is that developing and carrying out two different types of tests on an IC can be time-consuming.

SUMMARY OF THE INVENTION

The invention relates to a method carried out by an integrated circuit (IC) tester for testing an IC of the type including a set of logic blocks communicating through clocked devices, such as for example registers and flip-flops, that are arranged to form scan chains. The tester organizes the test into a succession of test cycles, each of a uniform test cycle period, and provides up to one clock signal pulse during each test cycle for clocking each clocked device with adjustable clock signal edge timing.

In accordance with the invention, at selected times during the functional test, the tester executes a capture procedure wherein it adjusts clock signal edge timing so that a delay between clocking of the input and output signals of selected logic blocks matches a desired target delay that is less than the test cycle period, thereby testing the ability of the logic blocks to operate properly at high frequency without path delay faults. The tester interrupts the functional test and executes a scan procedure immediately following each capture procedure to acquire data representing states of logic block output signals to enable the tester to determine whether one or more selected logic blocks experienced delay faults during the capture procedure.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The invention relates to a method carried out by an integrated circuit (IC) tester for testing an IC. The invention is defined by the claims appended to this specification, and the specification below describes one particular mode of practicing the invention as recited in the claims. To provide a thorough understanding of that particular mode of practicing the invention, the specification describes numerous details of that particular mode, but it will be apparent to those of skill in the art that modes of practicing the invention recited in the claims need not incorporate all such details.

Figure 1:
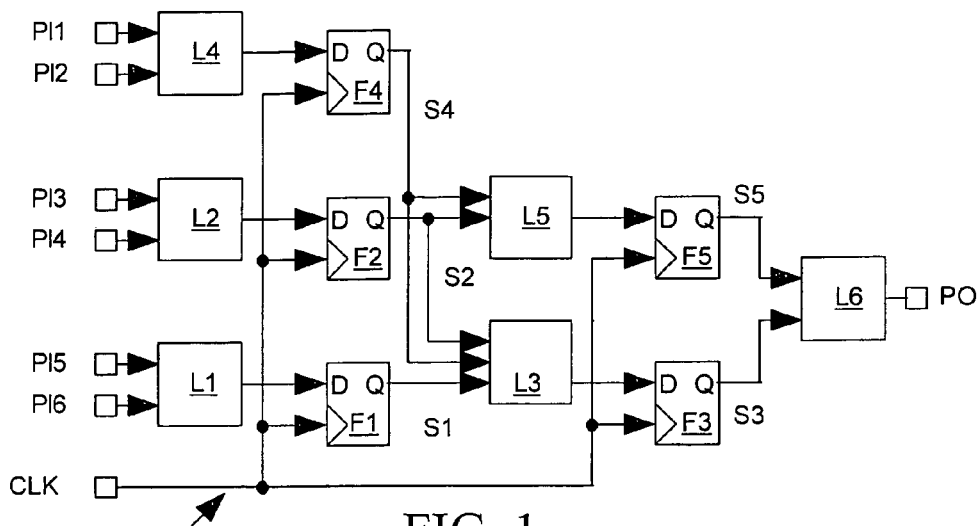
FIG. 1 depicts a prior art integrated circuit (IC) in block diagram form.
Figure 2:
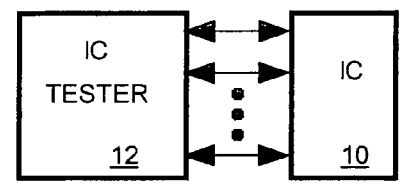
FIG. 2 depicts in block diagram form a prior art IC tester connected for testing the IC of FIG. 1.
Figure 3:
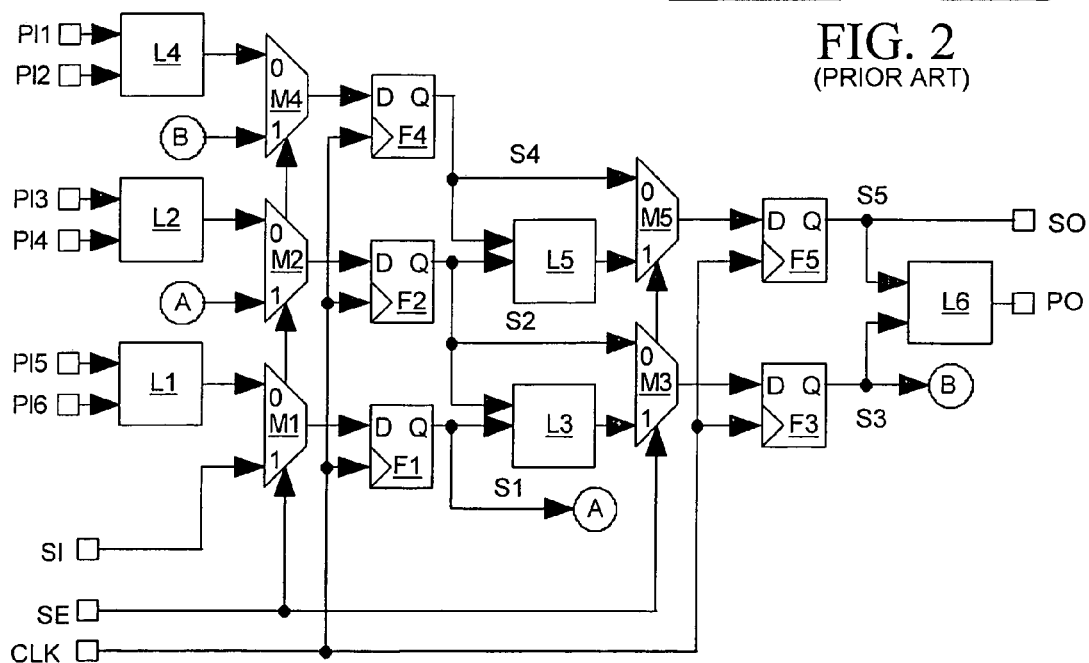
FIG. 3 depicts in block diagram form a prior art integrated circuit including a scan chain.

The invention relates in particular to a method for testing one or more ICs of the type including at least one scan chain. For example FIG. 3 illustrates a simple integrated circuit 14 including a set of six primary inputs PI1-PI6 for receiving input signals, a set of logic blocks L1-L6 by flip-flops F1-F5 for performing logic operations on the input signals to produce a single primary output signal P0. A single clock signal input (CLK) clocks all flip-flops. Although for simplicity IC 10 is illustrated as including only a few input, output and clock signals, logic blocks and clocked devices, a typical IC will have many more primary inputs and outputs, logic blocks and clocked devices, and may employ several different clock signals to clock the flip-flops.

Flip-flops F1-F5 are interconnected through a set of multiplexers M1-M5 to form a scan chain. During normal IC operation, an IC tester de-asserts (sets to a logical 0) the scan enable signal SE control input to multiplexers M1-M5 so that multiplexers M1-M5 connect the outputs of logic blocks L1-L5 to the inputs of flip-flops F1-F5, respectively. During a scan mode of operation, the tester asserts (sets to a logical 1) the SE control signal so that multiplexers M1-M5 connect the inputs and outputs of flip-flops F1-F5 in series between a scan input terminal SI and a scan output terminal SO. In the scan mode, successive edges of the CLK signal shift state data arriving from an IC tester on scan input terminal SI into flip-flips F1-F5 and shift state data representing the output signals S1-S5 of flip-flops F1-F5 out of the IC via scan output terminal SO. A tester can use the scan mode to read the states of the S1-S5 signals at the point at which the scan chain leaves its normal mode of operation, and to thereafter set the S1-S5 signals to desired states at the point at which the scan chain re-enters its normal mode of operation.

Figure 9:
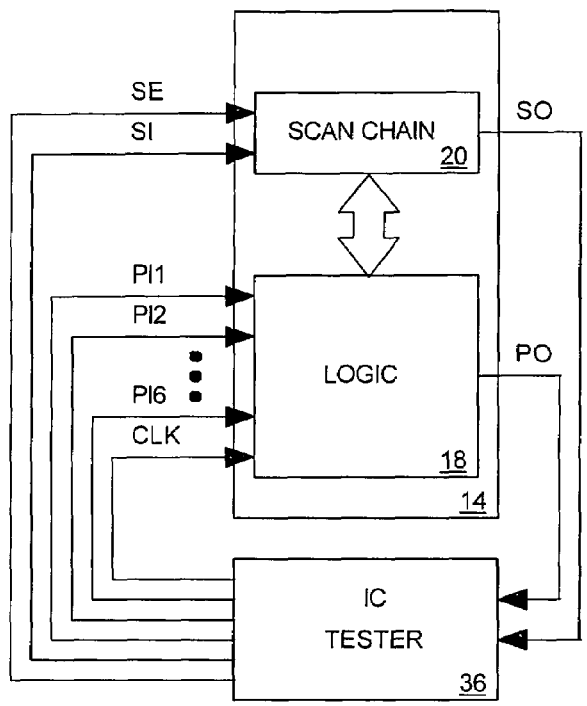
FIG. 9 depicts in block diagram form IC tester connected for testing the IC of FIG. 3 using a method in accordance with the invention

As illustrated in FIG. 9, an IC tester 36, programmed to carry out a method in accordance with the invention, can be connected to access the logic 18 of IC 14 via its primary input, primary output and clock signal terminals (PI1-PI6, P0, CLK) and to access the IC's scan chain via its SE, SI and SO terminals. Although not shown in FIG. 9, tester 36 may be connected for concurrently testing several ICs of a similar design. Tester 36 carries out a functional test on IC 1, organizing the test into a succession of test cycles, each of a uniform test cycle period. During each test cycle, tester 36 sets the IC's primary input signals PI1-PI6 to desired states, samples the IC's primary output signal P0 to determine whether it is of an expected state, and provides up to one CLK signal pulse for clocking the clocked devices with logic block 18.

Figure 10:
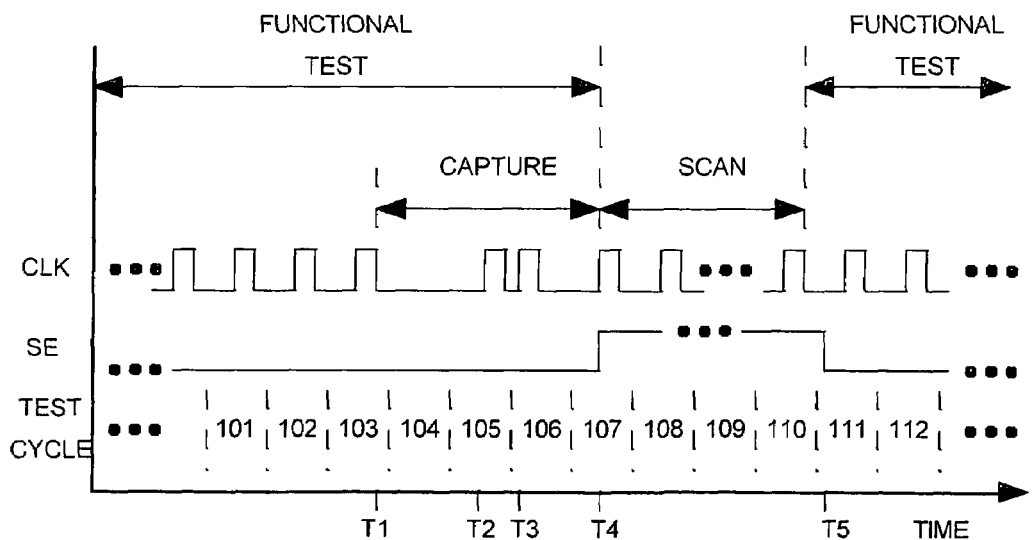
FIG. 10 is a timing diagram illustrating timing relationships between output signals of the tester of FIG. 9 during an IC test in accordance with the invention.

As illustrated in FIG. 10, tester 36 occasionally interrupts the functional test (such as at time T4) to carry out a "scan dump" procedure wherein it drives the SE signal high and uses scan chain 20 to shift out data on scan output terminal SO representing states of output signals of clock devices F1-F5 to determine whether they are of expected states at the point the functional test was interrupted, and to shift in data it supplies on scan input terminal SI to reset the output signals of the clocked devices F1-F5 to those states when it resumes the functional test, for example at time T5. Tester 36 then drives the SE signal low to set IC 14 in its normal operating mode, and resumes the functional test at time T5. Although FIG. 10 shows the functional test being interrupted by a scan procedure only once, the functional test may be interrupted by scan procedures several times.

The invention relates in particular to a "capture procedure" tester 36 carries out during the functional test immediately before each scan procedure. As shown in FIG. 10, tester 36 normally produces CLK signal pulses for clocking the clocked devices (flip-flops F1-F5 of FIG. 3) of the IC's logic 18 at a uniform rate during the function test except during a capture procedure. During a capture procedure, tester 36 adjusts the period T3-T2 between successive edges of the CLK signal to a desired "target delay" that is shorter than the uniform test cycle period, thereby testing the ability of portions of the IC's logic 18 that communicate though clocked devices F1-F5 to correctly respond to input signals with a delay no larger than the target delay. An excessive path delay in any logic block L1-L5 (FIG. 3) can cause an error in the state of the output signal of that block at time T3 which the tester can determine from the scan data acquired during the subsequent scan procedure.

A low speed tester that is not fast enough to perform an at-speed functional test, can use this technique during a low-speed functional test to perform delay fault testing of selected logic blocks within the IC even though the test cycle period is longer than the target period T3-T2 between CLK signal edges, provided that tester 36 can control the timing of CLK signal edges within each test cycle with sufficiently high resolution. The "idle" test cycle 104 in which no CLK signal pulses occur provide sufficient time to ensure the IC logic 18 settles to steady state before the delay default test begins at time T2. In some cases the idle cycle can be omitted.

Figure 11:
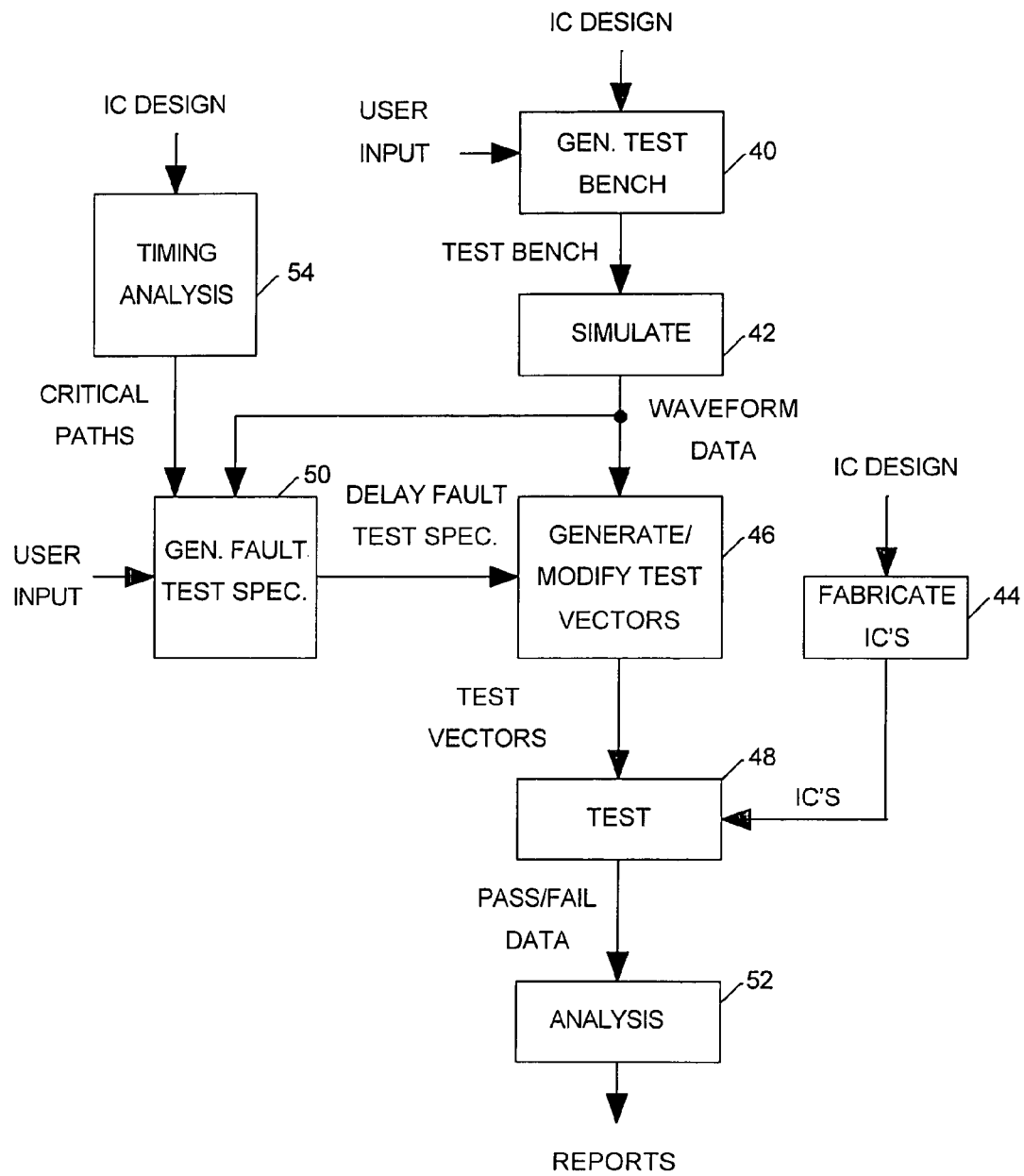
FIG. 11 is a data flow diagram illustrating an IC testing process in accordance with the invention.

FIG. 11 is a data flow diagram illustrating a process for producing an IC and testing it using a method in accordance with the invention. An IC designer typically generates an IC design in the form a netlist describing the IC as a collection of interconnected devices such as transistors, gates and the like. The designer then uses conventional computer-aided tools processing the IC design to generate a "test bench" (step 40) for programming a circuit simulator to simulate the behavior of the IC in response to a pattern of input signals specified by user input. As it simulates the IC (step 42), the simulator generates waveform data representing the behavior of selected input, output and internal signals of the IC. When, upon studying the behavior of the IC represented by the waveform data, the designer is satisfied that the IC design is correct, an IC fabricator produces a large number of copies of the IC described by the IC design (step 44). A test engineer then uses computer-aided tools to generate test vectors (step 46) for programming an IC tester to test one or more of the ICs (step 48). The test vectors produced at step 46 describe a functional test in accordance with the invention including capture and scan procedures carried out at various times during the functional test. A delay fault test specification indicates the test cycle in which each capture procedure is to begin and the target delay to be implemented during the capture procedure. The test engineer may (step 50) employ computer-aided tools processing the waveform data to produce the delay fault specification.

At step 48 the IC tester carries out the test, producing pass/fail data indicating whether each monitored output signal of each IC under test (including scan chain output data) is of an expected state during each cycle of the test. The test engineer uses data analysis software 52 to process the pass/ fail data to generate reports describing any detected IC failures, including any delay fault failures inferred from the scan data.

Figure 12:
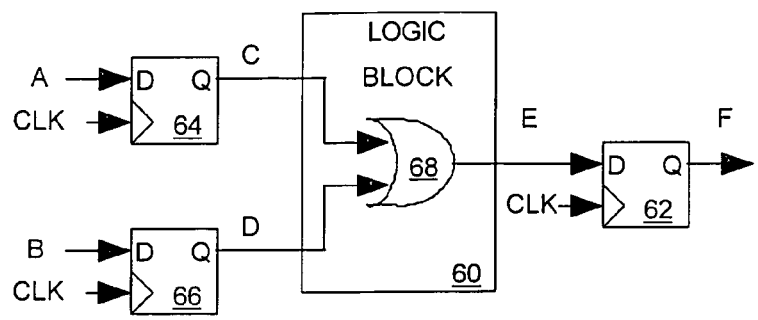
FIG. 12 is a schematic diagram depicting logic communicating through clocked devices clocked by a single clock signal.

FIG. 12 depicts a logic block 60 receiving supplying an output signal E to a clocked device 62 in response to input signals C and D from clocked devices 64 and 66. Devices 64 and 66 produce output signals C and D in clocked response to input signals A and B and device 62 produces output signal F in clocked response to its input signal E. Although not shown in FIG. 12, clocked devices 62-64 form part of a scan chain. While logic blocks are usually relatively complex, we assume as a simple example, that logic block 60 is a simple OR gate 68.

Referring to FIGS. 10 and 12, a test engineer can determine whether the path delay through gate 68 and device 62 is less than some target delay if tester 36 first sets signals C and D to initial states, such as $\{C, D\}=\{0, 0\}$ by clocking devices 64-68 at time T2 when $\{A, B\}=\{0, 0\}$ then clocks devices 64-68 at a time T3 when $\{A, B\}=\{0, 1\}$. If the path delay through logic block 60 and clocked device 62 is within the target delay (T3-T2}, the scan data acquired during the subsequent scan procedure will indicate that the output signal F of device 62 transitioned from a 0 to a 1 at time T3. Since there are other patterns of (C, D) signal state changes that can produce a state change in signal F, the test engineer may want tester 36 to perform a path delay test for more than one such pattern.

Referring to FIG. 11 user input at step 50 describes the state change patterns that are to be used for testing the path delays of selected blocks of the IC's logic, and during step 50 the fault test specification generator searches the waveform data output of the circuit simulator to locate instances of those patterns. When it finds an appropriate pattern, it determines the test cycles in which that pattern is to occur during the test and configures the delay fault specification to indicate that a delay fault test capture procedure is to occur during those test cycles and that a scan procedure is to occur following the capture procedure.

The designer selects the logic blocks that are to be delay tested. Since using this procedure to perform delay fault testing on every logic block can add a significant amount of processing time to a functional test, a test engineer may choose to select only logic blocks containing critical paths as delay test blocks. Referring to FIG. 11, conventional timing analysis software can process an IC design (step 54) to estimate the path delays between various nodes. For example of FIG. 12, timing analysis software can estimate the delay between a state change in signal D and signal F. That delay should be no larger than some target delay between edges of the clock signals clocking devices 64/66 and 62. The timing analysis software determines the "slack time" of each path, the difference between the target delay and the actual delay, which should be sufficiently positive for every path to allow for some variation in actual path delays from the estimated path delays. The timing analysis software designates paths having slack times smaller than a defined minimum as "critical paths" that should be designated as "delay test blocks" to be subjected to delay fault testing.

A test engineer may select delay test blocks for other reasons. For example, an IC design often incorporates logic blocks that are copies of blocks that have been incorporated into IC in the past and have been proven unlikely to include delay faults. The test engineer may therefore choose to configure the tester to perform delay fault testing only on logic blocks that are custom designed for that particular IC.

A test engineer may employ delay fault testing in accordance with the invention to "bin" an IC according to is maximum allowable operating frequency. In any batch of similar ICs, such as for example a set of ICs fabricated on the same silicon wafer, random process variations may allow some of the ICs to operate at a higher frequency than others without experiencing delay faults. For example, suppose the ICs are to be binned into three frequency ranges, F1-F2, F2-F3 and F3-F4, wherein F1, F2, F3 and F4 are frequencies selected such that F1<F2<F3<F4. When establishing the delay fault testing specification at step 50 (FIG. 11) the test engineer will request that the specification generator identify four instances of each desired delay fault testing pattern for input signals to each delay test block in the waveform data and to configure the delay fault specification to indicate that a delay fault test capture procedure is to occur during test cycles associated with each identified instance, with the target delay for each capture procedure being set to a different one of periods 1/F1, 1/F2, 1/F3 and 1/F4. The frequency range into which each IC is binned depends on which delay fault tests it passes.

Similarly, a test engineer may employ delay fault testing in accordance with the invention to determine whether path delays are influenced by changes in IC operating parameters such as supply voltage or temperature by repeating delay fault capture procedures while the IC operates under differing magnitudes of values of such operating parameters.

Analysis software 52 of FIG. 11 processing scan data produced at step 48 for a large number of ICs, such as for example all ICs residing as die on one or more silicon wafers, can for example, produce statistical timing analysis reports indicating the probability that selected signals of an IC of that design will contain delay faults or the probability that an IC of that design will experience a delay fault error at a particular IC operating frequency or at each of a plurality of IC operating frequencies.

The scan data acquired by testing several ICs of similar design can be processed, for example, to create histograms indicating a number of delay fault errors in signals conveyed by clocked devices of each scan chain, a number of delay fault errors in states of data signals conveyed by clocked devices clocked by each clock signal, a number of errors in states of each data signal, or a number of errors in data signal outputs of each delay test block.

The scan data acquired by testing several ICs of similar design formed as die on several semiconductor wafers can be processed, for example, to create a map of the semiconductor wafer indicating for each IC die position on the wafer, a number of errors detected in ICs formed at that ID die position.

For simplicity of explanation, the specification above describes the test method in accordance with the invention as being carried out on an IC of the type illustrated in FIG. 3 in which all clocked devices are clocked by the same clock signal CLK. However the method in accordance with the invention can be carried out on ICs having clocked devices clocked by more than one clock signal.

Figure 13:
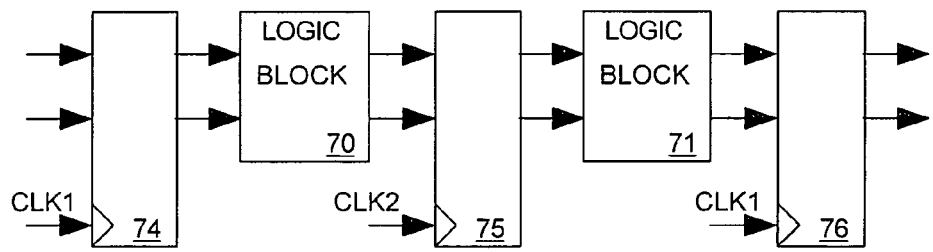
FIG. 13 is a schematic diagram depicting logic communicating through clocked devices clocked by two clock signals.
Figure 14:
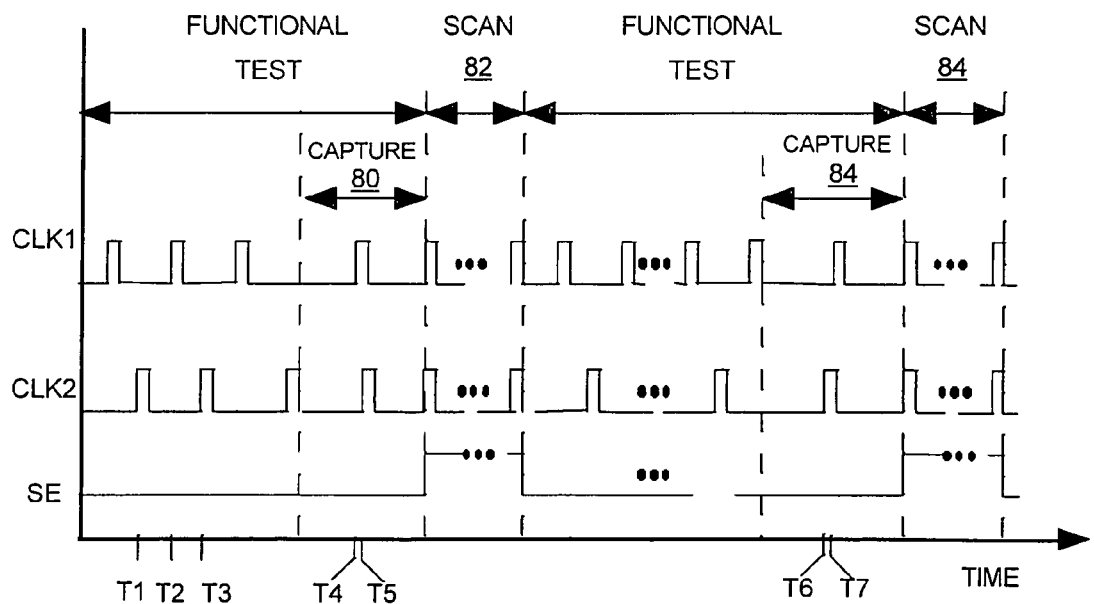
FIG. 14 is a timing diagram illustrating timing relationships between signals of the circuit of FIG. 13 during an IC test in accordance with the invention.

FIG. 13 depicts a portion of an IC including a pair of logic blocks 70 and 71 transmitting and receiving signals through clocked devices 74-76 which (though not shown in FIG. 13) form portions of scan chains. A clock signal CLK1 clocks devices 74 and 76 while a clock signal CLK2 clocks device 75. As illustrated in FIG. 13, during low-speed functional test portions of a test procedure in accordance with the invention, the CLK1 and CLK2 signals are of the same frequency but of differing phase. The CLK1 and CLK2 signal timing permits logic block 70 to have path delays as long as T3-T2 and logic block 71 to have a path delays as long as T2-T1 without experiencing delay fault errors. During a first capture procedure 80, the tester sets a target delay between CLK1 and CLK2 edges small (T5-T4) to enable it to determine from scan data acquired during a subsequent scan procedure 82, whether logic block 70 has path delays longer than T5-T4. During a subsequent capture procedure 84, the tester sets the target delay between CLK2 and CLK1 edges small (T7-T6) to enable it to determine from scan data acquired during a subsequent scan procedure 86, whether logic block 71 has path delays longer than T7-T6. Thus the tester can perform delay fault testing on both logic blocks 70 and 71, though not during the same capture procedure. Those of skill in the art will appreciate that the method can be similarly adapted for use in testing ICs having any number of differing clock signal domains.

Error Diagnosis

Figure 4:
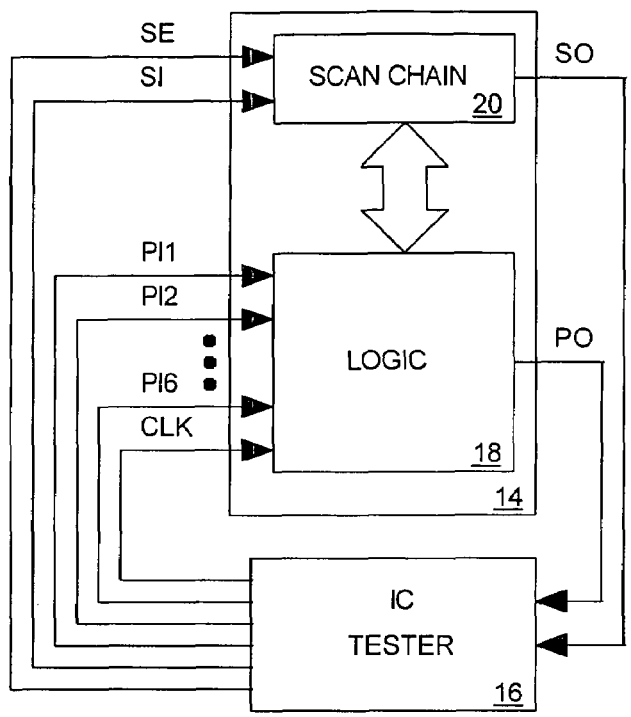
FIG. 4 depicts in block diagram form a prior art IC tester connected for testing the IC of FIG. 3
Figure 5:
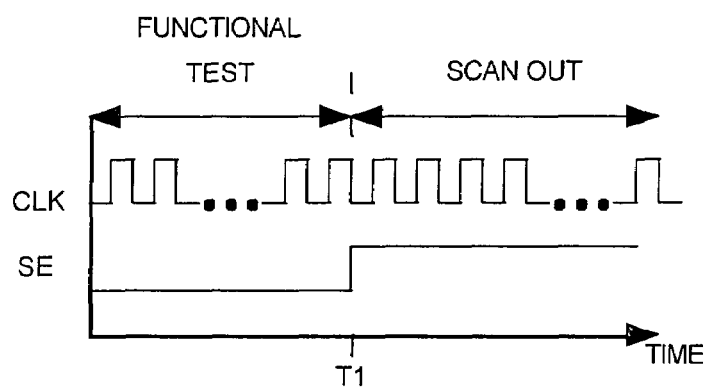
FIG. 5 is a timing diagram illustrating timing relationships between output signals of the tester of FIG. 4 during a prior art scan dump test.

As discussed above, FIG. 6 illustrates various pass/fail states of signals of IC 14 as detected by tester 16 of FIG. 4 during several cycles of a prior art at-speed functional test. Each small box represents a result of a comparison between a signal's actual state and its expected state during a clock cycle. An empty box indicates that the corresponding signal was of its expected state during the corresponding clock cycle. A solid black box indicates that the corresponding signal was of an unexpected state during the corresponding clock cycle and that the signal state error was a "initial error" in the sense that the error in the signal was caused by a defect in the logic block controlling the signal and not by an error in any input signal to that logic block. A box containing an X indicates that the corresponding signal was of an unexpected state during the corresponding clock cycle, and that the signal error propagated from an earlier error in another signal.

During an at-speed functional test in which tester 16 can observe only the IC's primary output signals P0, it reports an error in that signal at clock cycle 221. However it does not report the unobservable errors in signals S2, S3 and S5 at cycles 219 and 220. A test engineer may reprogrammed the tester to repeat the test three times from the first clock cycle, performing conventional scan dumps at cycles 220, 219 and then 218. At this point the tester output data will tell the test engineer only that errors occurred in signal S2 at cycle 219, in signals S3 and S5 at cycle 220, and in signal P0 at cycle 221. The test engineer will be able to infer that the error in signal S2 at cycle 219 was an original error, but will not be able to determine whether that error was due to a logic error in logic block L2 of FIG. 3 or was due to a path delay error in logic block L2 or whether the errors in signals S3, S5 and P0 were propagation errors or original errors resulting from logic faults or path delay errors in the logic blocks that generate those signals.

Figure 15:
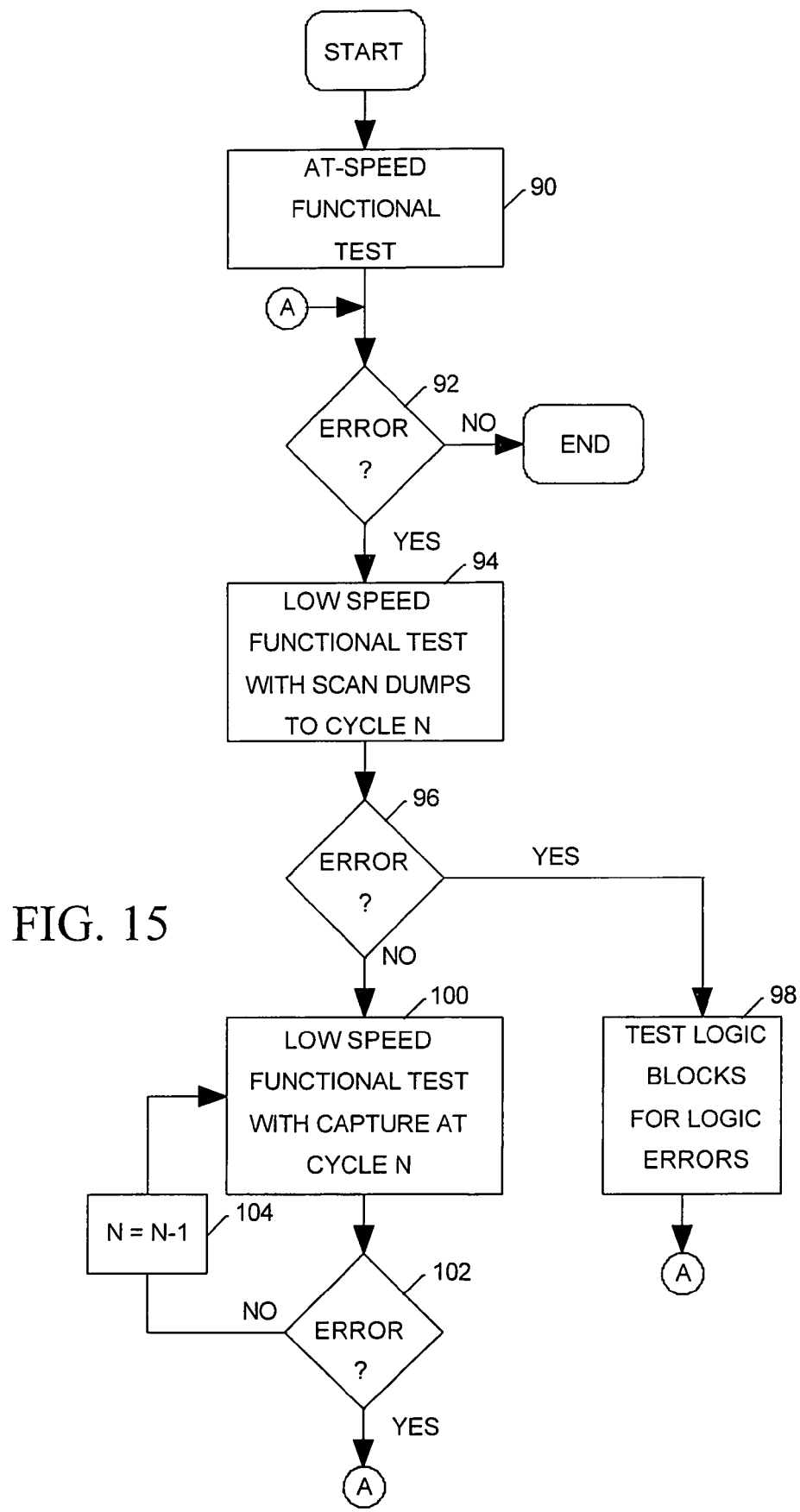
FIG. 15 is a flow chart illustrating an IC testing process in accordance with the invention.

FIG. 15 depicts an IC testing method in accordance with the invention that enables a test engineer to determine which logic block of an IC is a source of a signal error detected during an at-speed test, and also to determine whether the logic block is subject to a logic error or path delay error.

At step 90 the tester performs a conventional at-speed functional test, and at step 92 the results of the test are reviewed to determine some cycle N at which a first error is detected. If no error is detected, the process ends. If an error is detected in a signal during some Nth test cycle, then the test engineer will want to determine first whether the error resulted from a logic error or a path delay error. To do so, we perform a conventional low-speed functional test up to test cycle N (step 94), wherein following each of several test cycles prior to cycle N, the tester carries out a scan dump to determine whether any errors occurred in the IC's internal signals during those test cycles.

Figure 6:
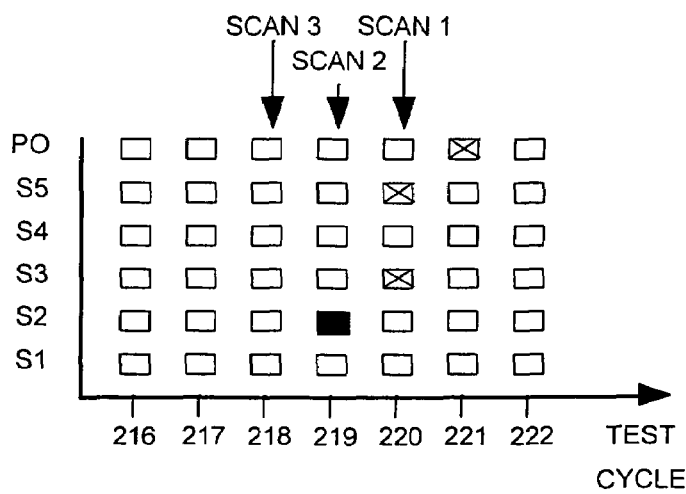
FIG. 6 is a diagram indicating pass/fail results of scan dump tests performed by the tester of FIG. 4.
Figure 7:
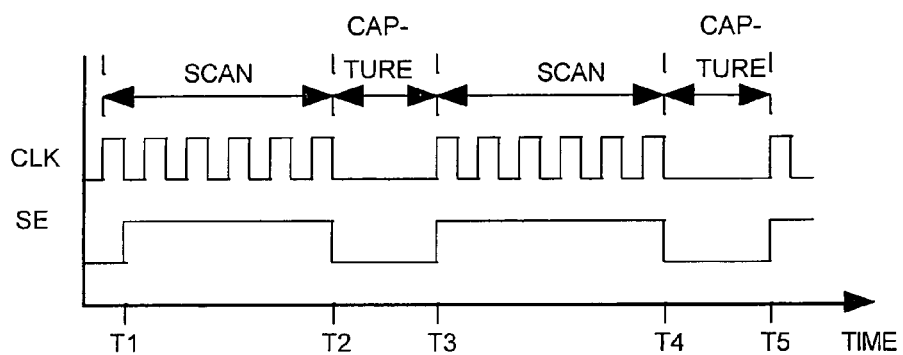
FIG. 7 is a timing diagram illustrating timing relationships between output signals of the tester of FIG. 4 during a prior art automatic test pattern generation (ATPG) scan test.
Figure 8:
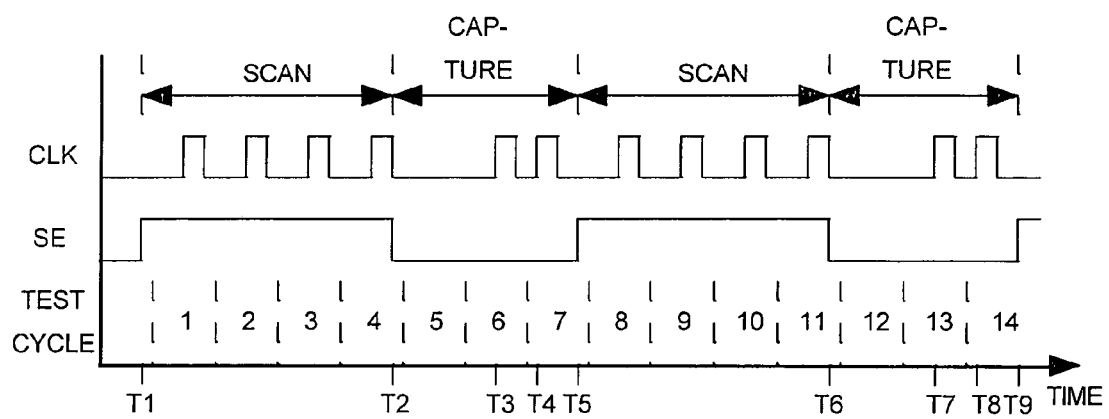
FIG. 8 is a timing diagram illustrating timing relationships between output signals of the tester of FIG. 4 during a prior art ATPG delay fault test.

For example, referring to FIG. 6, after performing an at-speed functional test at step 90, the tester results would show the error in signal P0 at test cycle 221, but would not show errors in the IC's internal signals during cycles 219 and 220 because the tester did not monitor those signals during the at-speed functional test. When, at step 94, the tester performs a low-speed functional test spanning cycles 0 through N=221, with scan dumps performed following cycles 217-220, the tester's output data for cycle 221 will show signal errors resulting only from logic errors, provided the low-speed test is slow enough to filter out all path delay errors.

If the low-speed functional test shows the errors depicted in FIG. 6 (step 96), the test engineer can infer that all of those signal errors resulted from one or more original logic errors, rather than from any path delay error, and can (step 98) use conventional techniques (such as ATPG scan testing) to determine which logic blocks producing signal exhibiting errors during the low speed functional test include logic errors.

If, at step 96, the low-speed functional test does not show an error in signal P0 at test cycle, the test engineer will know that the at-speed test error in signal P0 at cycle 221 arose from a path delay error, but will not yet be able to determine whether it was an original error arising form a path delay error in L6 or a propagated error. To resolve this, the tester first repeats the low-speed functional test for cycles 0 through 221, wherein the tester performs a capture procedure that ends at test cycle N (step 100). During the capture procedure, clock signal timing is adjusted so that if there is a path delay error in the logic block directly producing the signal in which the at-speed test error was detected at cycle N, that path delay error will again cause the error in that signal. However if the signal error was a propagation error, the signal error will not occur.

Referring to FIG. 6, In the example case, the capture procedure ends at cycle N=221, and since the error in signal P0 at time 221 was a propagation error resulting from a path delay error at cycle 219 rather than at test cycle 221, the test results will show no error in signal P0 at cycle 221.

When no error is detected (step 102) in the results of the low-speed test with capture ending at cycle N (step 100), the value of N is decremented (step 104) and the low speed functional test with capture at cycle N is repeated (step 100).

In the example case, the tester now ends the capture procedure at cycle 220, performing a scan dump before resuming the test at cycle 221 in order to determine whether there are any errors in signals S1-S5 at cycle 220. Since in this example, the at-speed test errors in signals S3 and S5 at cycle 220 and in signal P0 at cycle 221 propagated from an original path delay error in signal S2 at cycle 219, the low-speed test results will again show no error in signal P0 at cycle 221 and will show no errors in signals S2 and S5 at cycle 220.

The process continues to loop through steps 100-104 until a signal error is detected at cycle N. In the example case, the tester will detect the error in signal P0 at cycle 221 only when the tester carries out a capture procedure ending at cycle J=219 that forces the timing error in signal S2. The scan dump carried out following the capture procedure will show the error in signal S2 at cycle 219. Since that error propagates to signal P0 at cycle 221, the tester will also detect an error in signal P0 at cycle 221. The test engineer can now infer from all of the test results that the error in signal P0 at cycle 221 was a propagation error resulting from an original path delay error in the logic block L2 producing signal S2 at cycle 219.

After determining the source of the error at cycle N, the at-speed functional test results are reviewed at step 92 to determine whether another signal error occurred at some later cycle, and if so, steps 94-104 are repeated as necessary to determine the cause of that error. The process continues to loop through step 92-104 to determine the cause of all signal errors detected in the output of the at-speed function test, with the process ending at step 92 after determining the causes of all signal errors.

The procedure outlined in FIG. 15 therefore enables a test engineer not only to locate the logic blocks that are sources of signal errors detected in an at-speed test, but also to determine whether the errors within those logic blocks are logic errors or path delay errors.

Thus using a method in accordance with the invention, an IC tester performing a low-speed functional test can detect delay faults in selected logic blocks of an IC by carrying out a set of capture procedures as described above during the functional test, provided the tester interrupts the functional test following each capture procedure to acquire scan data indicating results of the capture procedure.

The invention claimed is:

1. A method for performing a test on at least one integrated circuit (IC), wherein each IC produces output signals in response to input signals and comprises a plurality of logic blocks and a plurality of clocked devices, wherein the clocked devices of each IC are interconnected to form at least one scan chain, wherein during a normal mode of scan chain operation, the clocked devices forming each scan chain convey data signals between logic blocks of the IC, wherein during a scan mode of scan chain operation, each scan chain provides output state data representing states of the data signals conveyed by the clocked devices forming the scan chain and then sets the data signals to states indicated by input state data, and wherein the test spans a plurality of test cycles of a uniform test cycle period, the method comprising the steps of:
   a. selecting at least one of the logic blocks as a delay test block,
   b. performing a functional test spanning a plurality of test cycles on each IC by placing each scan chain in its normal mode of operation, by providing the input signals to the IC, by clocking each clocked device of the IC, and by monitoring the IC's output signals to determine whether they are of expected states,
      wherein, the functional test includes at least one capture procedure wherein clocking of each clocked device receiving an output data signal of at least one of the delay test blocks follows clocking of each clocked device providing an input data signal to that delay test block with a target delay that is shorter than the test cycle period, and
      wherein during other portions of the functional test, clocking of each clocked device receiving an output data signal of any one of the delay test blocks follows clocking of each clocked device providing an input data signal to that delay test block with a target delay that is longer than the target period, and
   c. temporarily interrupting the functional test following each capture procedure to carry out a scan procedure by placing each scan chain in the scan mode of operation and acquiring the output state data from the scan chain representing states of the data signals conveyed by the clocked devices at a point when the functional test was interrupted.

2. The method in accordance with claim 1 wherein for each delay test block, clocking of each clocked device receiving an output data signal of the delay test block follows clocking of each clocked device providing an input data signal to the delay test block with a target delay that is longer than the test cycle period during at least one portion of the functional test.

3. The method in accordance with claim 1 further comprising the step of
   d. determining from the output state data acquired during step b whether any delay test block has a delay fault.

4. The method in accordance with claim 1 further comprising the step of
   d. supplying input state data to each scan chain during each scan procedure to set the data signals conveyed by the clocked devices forming the scan chain to states of the data signals conveyed by the clocked devices at a point when the functional test was interrupted.

5. The method in accordance with claim 1 further comprising the steps of:
   d. employing a circuit simulator to generate waveform data representing predicted behavior of the data signals received and generated by each delay test block during the functional test, and
   e. for each delay test block, processing the waveform data to identify a test cycle during the functional test that a particular state pattern will occur in data signals provided as input to the delay test block and configuring the functional test carried out at step b so that a capture procedure occurs following the identified test cycle.

6. The apparatus in accordance with claim 1 wherein steps b and c are carried out for each of a plurality of ICs of similar design, the method further comprising the step of
   d. analyzing the acquired scan data to determine a probability that an IC of that design will experience a delay fault error at a particular IC operating frequency.

7. The method in accordance with claim 1
   wherein for each delay test block, a plurality of capture procedures are carried out during step a, each capture procedure employing a separate target period.

8. The method in accordance with claim 7 further comprising the step of:
   d. processing output state data acquired during step c to identify an operating frequency range of each IC.

9. The method in accordance with claim 8 wherein steps b and c are carried out for each of a plurality of ICs of similar design, the method further comprising the step of
   d. analyzing the acquired scan data to determine a probability that an IC of that design will experience a delay fault error at each of a plurality of IC operating frequencies.

10. The method in accordance with claim 1 wherein steps b and c are carried out for each of a plurality of ICs of similar design, the method further comprising the step of
    d. analyzing the acquired scan data to detect errors in each of selected data signals conveyed by the clocked devices, and
    e. creating a histogram indicating a number of delay fault error in signals received by clocked devices of each scan chain.

11. The method in accordance with claim 1 wherein steps b and c are carried out for each of a plurality of ICs of similar design, and wherein a plurality of clock signals clock the clocked devices, the method further comprising the steps of:
    d. analyzing the scan data acquired at step b to detect errors in each of selected data signals conveyed by the clocked devices clocked by each clock signal, and
    e. creating a histogram indicating for each clock signal, a number of errors in states of selected data signals conveyed by clocked devices clocked by that clock signal.

12. The method in accordance with claim 1 wherein steps b and c are carried out for each of a plurality of ICs of similar design, the method further comprising the step of d. analyzing the scan data acquired at step b to detect errors in each of selected data signals conveyed by the clocked devices, and e. creating a histogram indicating, for each of the selected data signals, a number of errors in states of the data signal.

13. The method in accordance with claim 1 wherein steps b and c are carried out for each of a plurality of ICs of similar design, the method further comprising the step of:

d. analyzing the acquired scan data to detect errors in states of data signal outputs of each delay test block, and e. creating a histogram indicating for each delay test block a number of errors in data signal outputs of that delay test block.

14. The method in accordance with claim 1 wherein steps b and c are carried out for each of a plurality of ICs of similar design implemented as die at separate die positions on each of a plurality of semiconductor wafers, the method further comprising the step of:

d. analyzing the acquired scan data to detect errors in each IC, e. creating a semiconductor wafer map indicating a number ICs formed at each die position exhibiting delay fault errors.

15. The method in accordance with claim 1 wherein the at least one IC is connected to a source of supply voltage, and wherein steps b and c are carried out for each of supply voltage magnitudes.

16. The method in accordance with claim 1 wherein steps b and c are carried out for each of a plurality of IC operating temperatures.

17. A method for testing an integrated circuit (IC) comprising a plurality of logic blocks and a plurality of clocked devices providing paths for data signals passing between the logic blocks to determine whether the logic blocks can operate with the clock devices clocked at their specified clock frequencies, wherein the IC produces IC output signals in response to the data signals, the method comprising the steps of:

a. performing an at-speed first functional test on the IC with its clocked devices clocked at the specified clock frequencies to produce first data indicating states of the IC output signals during a first plurality of test cycles;

b. processing the first data to determine whether it indicates that an IC output signal had a state error during the first functional test;

c. upon determining at step b that an IC output signal had a state error during a test cycle, performing a low-speed second functional test on the IC in which all clocked devices are clocked at rates lower than their specified clock frequencies to produce second data indicating IC output signal states during a second plurality of test cycles; and d. following step c, processing the first and second data to determine whether the IC output signal state error during the first functional test resulted from an excessive path delay in at least one of the logic blocks; and e. upon determining at step d that an excessive path delay caused the IC output signal state error during the first functional test, performing at least one third functional test on the IC to produce third data indicating IC output signal states during a third plurality of test cycles;

wherein during one portion of each third functional test a capture procedure is executed wherein the clocked devices are clocked at their specified clock frequencies, and wherein during other portions of the each third functional test the clocked devices are clocked at rates lower than their specified clock frequencies.

18. The method in accordance with claim 17 further comprising the step of:

f. processing the third data produced during each third functional test to determine whether the IC output signal state error occurred during that third functional test.

19. The method in accordance with claim 18 further comprising the steps of g. when the third data produced during any said third functional test indicates that no state error occurred in the IC output signal, carrying out a next one of the third functional tests, and h. when the third data produced during any said third functional test indicates that the state error occurred in the IC output signal, refraining form carrying out a next one of the third functional tests.

20. The method in accordance with claim 19 wherein the clocked devices are interconnected to form at least one scan chain, wherein during a normal mode of scan chain operation, the clocked devices forming each scan chain convey the data signals between logic blocks of the IC, wherein during a scan mode of scan chain operation, each scan chain provides scan data representing states of the data signals conveyed by the clocked devices forming the scan chain, wherein during the first, second and third functional tests, the scan chain is operated its normal mode of operation, and wherein the method further comprises the step of:

i. temporarily interrupting each third functional test following its capture procedure to carry out a scan procedure by placing each scan chain in the scan mode of operation and acquiring the scan data from the scan chain representing states of the data signals conveyed by the clocked devices at a point when the functional test was interrupted.

21. The method in accordance with claim 20 wherein a plurality of third functional tests are carried out at step e, and wherein the capture procedure begins at a different test cycle of each third functional test.

22. The method in accordance with claim 21 further comprising the step of:

f. processing the scan data produced during at least one third functional test to determine whether a state error occurred in an output of any of the clock device during the capture procedure.

23. The method in accordance with claim 20, wherein when the third data produced during any said third functional test indicates that the state error occurred in the IC output signal, processing the scan data acquired during the capture procedure to determine whether the output state scan data indicates any errors in the data signals conveyed by the clocked devices.

* * * * *